United States Patent
Clark

(10) Patent No.: US 6,173,192 B1
(45) Date of Patent: *Jan. 9, 2001

(54) INTERACTIVE VOICE RESPONSIVE RADIO TUNING SYSTEM

(75) Inventor: Larry K. Clark, Glendale, AZ (US)

(73) Assignee: Honeywell International Inc., Morristown, NJ (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/723,067

(22) Filed: Oct. 1, 1996

(51) Int. Cl.[7] .................................................. H04B 1/00
(52) U.S. Cl. ............................................... 455/563; 455/79
(58) Field of Search ................................... 455/79, 151.1, 455/151.2, 152.1, 161.2, 158.5, 183.2, 185.1, 186.1, 563; 704/275

(56) References Cited

U.S. PATENT DOCUMENTS

| 4,426,733 | * | 1/1984 | Brenig | 455/79 |
| 4,737,976 | * | 4/1988 | Borth et al. | 455/563 |
| 4,827,520 | * | 5/1989 | Zeistra | 704/275 |
| 5,146,538 | * | 9/1992 | Sobti et al. | 455/79 |
| 5,152,012 | * | 9/1992 | Schwob | 455/158.5 |
| 5,263,181 | * | 11/1993 | Reed | 455/152.1 |
| 5,325,421 | * | 6/1994 | Hou et al. | 704/275 |
| 5,393,713 | * | 2/1995 | Schwob | 455/158.5 |
| 5,657,425 | * | 8/1997 | Johnson | 704/275 |
| 5,719,921 | * | 2/1998 | Vysotsky et al. | 704/275 |

FOREIGN PATENT DOCUMENTS

| 0145669 | * | 6/1985 | (EP) | H03J/9/04 |
| 8701546 | | 3/1987 | (WO). | |

* cited by examiner

Primary Examiner—Reinhard J. Eisenzopf
Assistant Examiner—Makoto Aoki

(57) ABSTRACT

A system for automatically tuning the radio equipment of an aircraft in response to a verbal communication to the system.

17 Claims, 2 Drawing Sheets

INTERACTIVE VOICE RESPONSIVE RADIO TUNING SYSTEM

BACKGROUND OF THE INVENTION

The cockpit of an aircraft is encumbered with many switches and knobs that a pilot must use in flying a plane. In addition, there are many items a pilot must be aware of which require the pilot to look down in the cockpit and away from the outside world. This is called "heads down" time and is not desirable for flying. Presently, in the area of radio communication from the pilot to various ground facilities, the pilot must find the facility information desired and cross reference the facility name with a separate radio frequency index. Once this frequency is found the pilot must adjust a radio device manually to the frequency that matches the facility desired by the pilot. This is very cumbersome and requires a lot of "heads down" time as well as time in general.

BRIEF DESCRIPTION OF THE PRESENT INVENTION

SUMMARY OF THE INVENTION

An interactive voice responsive system for radio tuning including a voice recognition device responsive to a verbal command. In response to the verbal input to the voice recognition device, a digital signal of the verbal command is sent to a database. The database matches the digital signal with a file in the database synonymous with the digital signal and selects the file. Files in the database contain information such as frequency. The frequency of the file selected is sent to a radio and causes the radio device to be tuned to that frequency.

DETAILED DESCRIPTION OF THE PRESENT INVENTION

The present invention is a system that allows automatic channel selection of a radio device based on a verbal input of a facility name.

Figure 1:
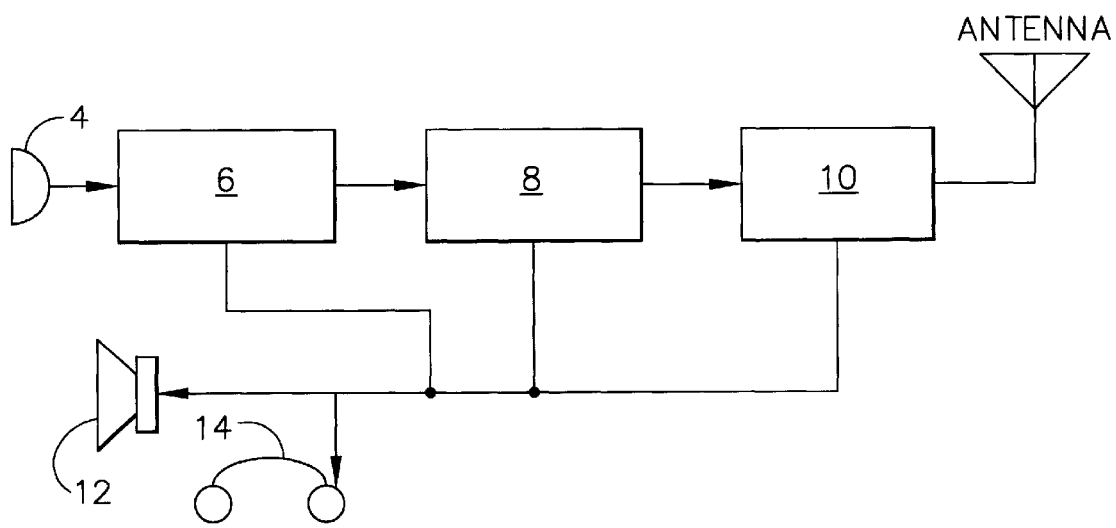
FIG. 1 shows a diagram of a voice responsive radio tuning system for an aircraft.
Figure 2:
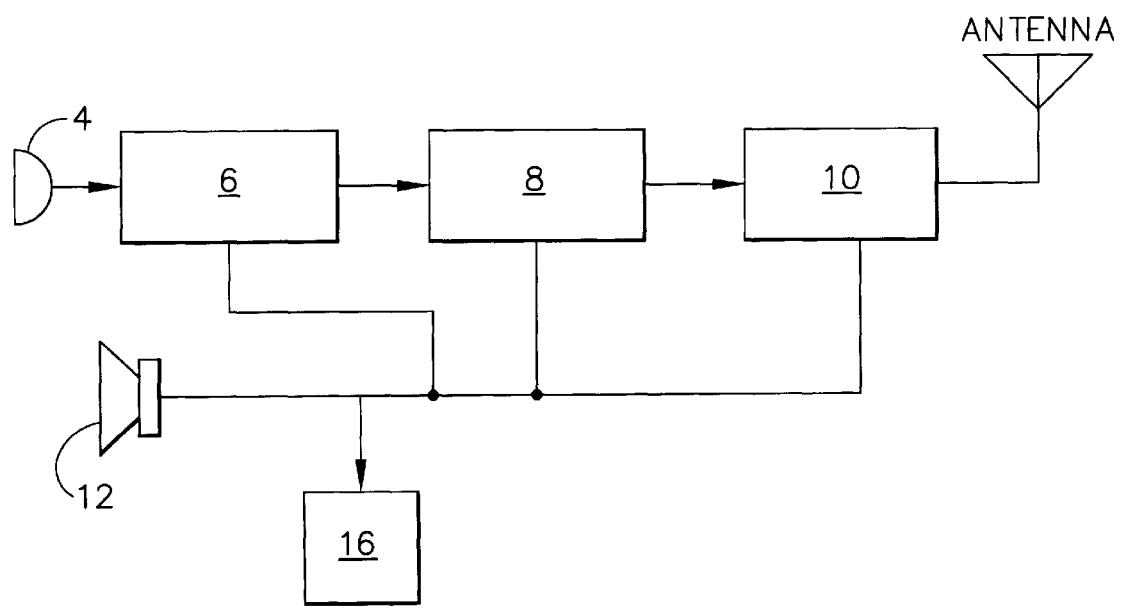
FIG. 2 shows a voice responsive radio tuning device using a visual device for confirmation means.

FIG. 1 shows the present invention which includes a microphone 4, voice recognition device 6, a database with frequencies and facility names 8, a radio device 10, and a speaker 12 and/or headphones 14. A pilot of an aircraft speaks into the microphone 4 and says a facility name to be contacted. The voice recognition device 6 changes the facility name into a digital signal that is sent to the database 8. The database 8 is any system that stores information, such as a computer, and contains information based on a facility name. The facility name that is spoken is matched with a file with that facility name and information is provided including a frequency signal. This digital frequency signal is sent to the radio device 10. Digital radio devices are well known in the field of technology and any known radio device would operate with this system. Based on this frequency signal, the radio device 10 is switched to the new frequency. The voice recognition device 10 provides a verbal confirmation message back to the pilot via a device such as headphones 14 or speakers 12. The audio signal is a verbal signal stating the facility name and frequency. The pilot would then confirm the selection with an activation command and the radio device 10 would be tuned to the selected frequency. In another embodiment, the confirmation device could be a visual device 16 as seen in FIG. 2.

Another advantage to the present invention, is that the voice recognition device 6 can receive facility names that are communicated through the radio device 10 itself. For example, the pilot or co-pilot may be in communication with a facility when the facility advises that another facility needs to be contacted. The facility would communicate the aircraft identification, other facility name and/or frequency which the voice recognition device 6 would receive and process through the system. As can be seen, the present invention saves a lot of time and is much less cumbersome.

The voice recognition device 6 sends a verbal signal to the speaker 12, or any confirmation device, for confirmation to tune the radio device 10 to the new frequency. However, if the database 8 cannot match the spoken facility name with a frequency, then a query signal is sent to the speaker 12 requesting additional clarification from the pilot.

Figure 3:
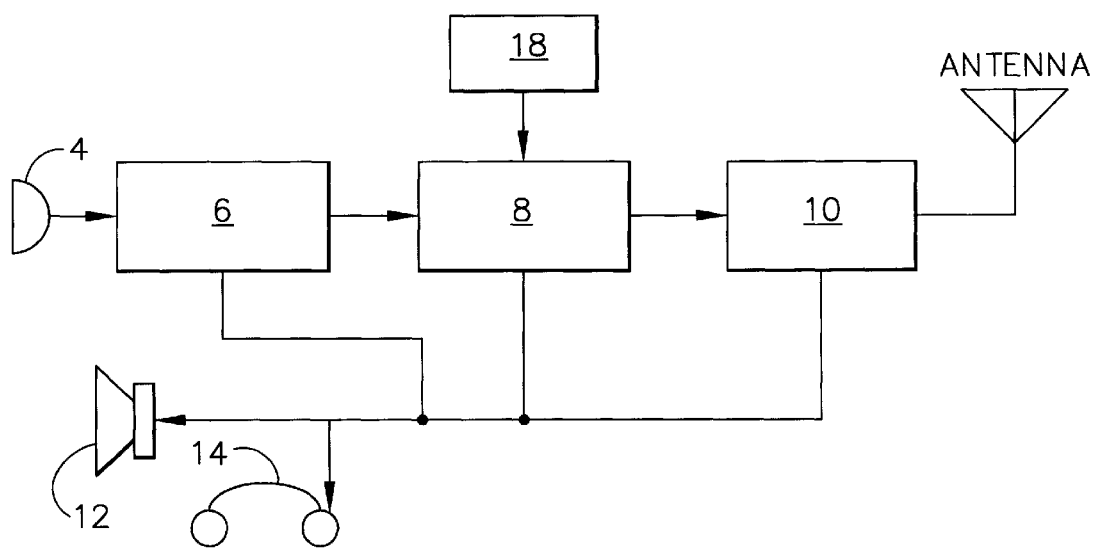
FIG. 3 shows a voice responsive radio tuning device in use with a position determining device.

Other inputs can be transmitted to the database 8 to assist the selection task and save time. One input that can be provided is the current position of the aircraft. This information would be provided by any position determining device 18 that would be connected to the database 8 as shown in FIG. 3. Providing the aircraft's current position to the database 8 will prevent any confusion between locations that have the same name, but are locations in different states or even different countries. For example, a confusion in the database 8 could exist between a facility in London, England and a facility in London, Ky. With the present position provided, the database 8 would search for the facility closest to the aircraft. Therefore, if the aircraft was flying to London, England, the database 8 would choose the facility in London, England instead of the facility in London, Ky.

Figure 4:
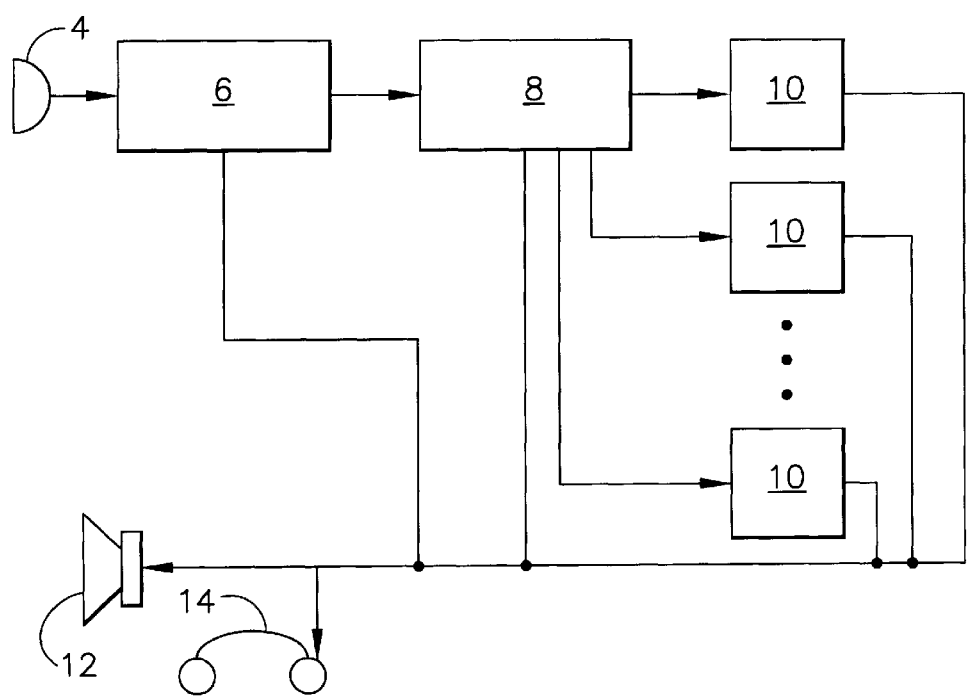
FIG. 4 shows a voice responsive radio tuning device in use with a plurality of radio devices.

As seen in FIG. 4, another input that can be provided to the database 8 via verbal instruction would be which radio device the pertinent information from the database 8 should be sent to. The cockpit of an aircraft has many radio devices, such as navigational radio device, radar transponder device and communication radio device. Therefore, it is necessary to determine which radio device information should be sent to so that time and errors can be prevented. An oral command designating the radio device would be relayed to the voice recognition device 6 via the microphone 4. Once the frequency has been determined in the database 8, this information is sent to the correct radio device 10 as designated by the oral command. If the radio device was not specified, the database 8 would not know which radio device the pertinent information needed to be sent to and a query signal would be sent to the speaker 12 for clarification. Supplying the specific radio device to be used is more efficient and saves time by avoiding need for clarification, or manual switch device selection by the pilot of which radio device is to be used.

This invention has been described herein in considerable detail in order to comply with the Patent Statutes and to provide those skilled in the art with the information needed to apply the novel principles and to construct and use such specialized components as are required. However, it is to be understood that the invention can be carried out by specifically different equipment and devices, and that various modifications, both as to the equipment details and operating procedures, can be accomplished without departing from the scope of the invention itself.

What is claimed is:

1. A method of tuning a radio device comprising the steps of:

establishing radio communication with a remote facility using the radio device located on an aircraft, receiving a radio message from the remote facility using the radio device, wherein the radio message includes a desired facility name;

automatically passing the radio message containing the desired facility name into a voice recognition apparatus located on the aircraft;

determining a position of the aircraft with a position determining apparatus which is independent of the radio device;

identifying a preferred facility name from a plurality of facilities having names similar to the desired facility name based on the aircraft position; and matching the preferred facility name with a facility frequency associated with the preferred facility name.

2. The method of claim 1, further comprising the step of tuning the radio device to the facility frequency.

3. The method of claim 2, further comprising the step of sending a verbal signal to a user to confirm the steps of identifying and tuning.

4. An instrument tuning system comprising:

a communication radio device located on an aircraft, wherein the radio device is configured to receive a radio message from a remote facility and the radio message includes a desired facility name;

a voice recognition apparatus, wherein the voice recognition apparatus is configured to receive the radio message containing the desired facility name from the radio device and to produce a facility signal corresponding to the desired facility name;

a position determining apparatus configured to determine a position of the aircraft and produce a position signal;

a database, responsive to the input apparatus, configured to receive the facility signal and the position signal, wherein the database selects a preferred facility from a plurality of facilities with similar names based on the facility signal and the position signal and produce an output signal corresponding to the preferred facility.

5. The system of claim 4, further comprising a confirmation apparatus connected to the instrument confirming that the instrument is tuned to he desired channel.

6. The system of claim 5, wherein the confirmation apparatus is a speaker.

7. The system of claim 5, wherein the confirmation apparatus is a visual device.

8. The system of claim 5, wherein a clarification output is sent to the confirmation apparatus requiring additional verbal information to allow the database to find the preferred facility correctly corresponding with the verbal information supplied.

9. A radio tuning system comprising:

a radio device located on an aircraft, wherein the radio device is configured to receive a radio message from a remote facility and the radio message includes a desired facility name;

a voice recognition apparatus located on the aircraft, wherein the voice recognition apparatus is configured to receive the radio message including the desired facility name from the radio device and to produce an indicia of the desired facility name;

a position determining apparatus located on the aircraft, wherein the position determining apparatus is configured to determine a position of the aircraft;

a database configured to receive the indicia of the desired facility name and indicia of the aircraft position from the position determining apparatus, wherein the database selects a preferred facility from a plurality of facilities having names similar to the desired facility name based on the indicia of the aircraft position and produce a frequency signal based on the preferred facility; and wherein the radio device is coupled to the database, and the radio device is further configured to be tuned based on the frequency signal received from the database.

10. The system of claim 9, wherein the voice recognition apparatus is further configured to receive a radio device name corresponding to the radio device to be tuned.

11. The system of claim 9, further comprising a confirmation apparatus connected to the radio device confirming that the radio device is tuned to the desired channel.

12. The system of claim 9, wherein the confirmation apparatus is a speaker.

13. The system of claim 9, wherein the confirmation apparatus is a visual device.

14. A method of identifying a preferred facility, comprising the steps of:

establishing radio communication with a remote facility using a radio device located on an aircraft;

receiving a radio message from the remote facility using the radio device, wherein the radio message includes a desired aircraft facility name;

automatically passing the radio message containing the desired aircraft facility name into a voice recognition apparatus located on the aircraft;

determining a position of the aircraft;

comparing the aircraft position to the positions of a plurality of facilities having names similar to the desired aircraft facility name; and identifying the preferred facility name from the plurality of facilities according to the comparison.

15. The method of claim 14, further comprising the step of matching the preferred facility name with a facility frequency associated with the preferred facility name.

16. The method of claim 15, further comprising the following step:

tuning the radio device to the facility frequency.

17. The method of claim 16, further comprising the step of sending a verbal signal to a user to confirm the steps of identifying and tuning.

* * * * *